United States Patent
Kholodenko

[11] Patent Number: 6,033,478
[45] Date of Patent: Mar. 7, 2000

[54] WAFER SUPPORT WITH IMPROVED TEMPERATURE CONTROL

[75] Inventor: Arnold Kholodenko, San Francisco, Calif.

[73] Assignee: Applied Materials, Inc., Santa Clara, Calif.

[21] Appl. No.: 08/730,123

[22] Filed: Nov. 5, 1996

[51] Int. Cl.[7] .......................... C23C 16/00; C23C 14/00
[52] U.S. Cl. .................. 118/500; 118/715; 118/728; 156/345; 204/298.15; 361/234; 279/128
[58] Field of Search ........................ 118/715, 728, 118/729, 730, 500; 156/345; 204/298.15; 269/21; 361/234; 279/128

[56] References Cited

U.S. PATENT DOCUMENTS

| | | | |
|---|---|---|---|
| 3,724,835 | 4/1973 | Gnoth | 269/21 |
| 3,907,268 | 9/1975 | Hale | 268/21 |
| 4,508,161 | 4/1985 | Holden | 165/1 |
| 4,527,620 | 7/1985 | Pedersen et al. | 165/80 D |
| 4,535,834 | 8/1985 | Turner | 165/80 R |
| 4,565,601 | 1/1986 | Kakehi et al. | 156/643 |
| 4,603,466 | 8/1986 | Morley | 29/569 R |
| 4,771,730 | 9/1988 | Tezuka | 118/723 E |
| 4,842,683 | 6/1989 | Cheng et al. | 156/345 |
| 4,999,320 | 3/1991 | Douglas | 437/225 |
| 5,155,331 | 10/1992 | Horiuchi et al. | 219/121.43 |
| 5,191,218 | 3/1993 | Mori et al. | 250/453.11 |
| 5,238,499 | 8/1993 | van de Ven et al. | 118/724 |
| 5,267,607 | 12/1993 | Wada | 165/80.1 |
| 5,270,266 | 12/1993 | Hirano et al. | 437/228 |
| 5,350,479 | 9/1994 | Collins et al. | 156/345 |
| 5,458,687 | 10/1995 | Shichida et al. | 118/724 |
| 5,474,614 | 12/1995 | Robbins | 118/728 |
| 5,486,132 | 1/1996 | Cavaliere et al. | 451/75 |
| 5,547,539 | 8/1996 | Arasawa et al. | 156/626.1 |
| 5,583,736 | 12/1996 | Anderson et al. | 361/234 |
| 5,720,818 | 2/1998 | Donde et al. | 118/500 |
| 5,838,528 | 11/1998 | Os et al. | 361/234 |

FOREIGN PATENT DOCUMENTS 0 619 381 A1  10/1994  European Pat. Off. .

*Primary Examiner*—Jeffrie R Lund
*Attorney, Agent, or Firm*—Thomason Moser Patterson

[57] ABSTRACT

Apparatus for supporting a workpiece. The apparatus has either a mechanical or electrostatic chuck having a workpiece support surface that specifically directs the flow of a heat transfer gas from at least one gas supply port towards a drain port. A pressure valve beyond the drain port regulates heat transfer gas pressure to ensure adequate gas density for cooling by conduction and adequate gas flow for controlled leakage through the valve.

24 Claims, 2 Drawing Sheets

WAFER SUPPORT WITH IMPROVED TEMPERATURE CONTROL

BACKGROUND OF THE INVENTION

1. Field of the Invention

The invention relates generally to mechanical or electrostatic clamping chucks for holding a workpiece and, more specifically, to an improved topographical structure of a support surface of such chucks to increase heat transfer gas distribution along the bottom surface of a workpiece retained by the chuck.

2. Description of the Background Art

Mechanical and electrostatic clamping chucks are used for holding a workpiece in various applications ranging from holding a sheet of paper in a computer graphics plotter to holding a semiconductor wafer within a semiconductor wafer process chamber. In semiconductor wafer processing equipment, mechanical and electrostatic chucks are used for clamping wafers to a pedestal during processing. The pedestal may form both an electrode (in electrostatic chuck applications) and a heat sink. These chucks find use in etching, chemical vapor deposition (CVD), and physical vapor deposition (PVD) applications.

Mechanical chucks typically secure a workpiece to the chuck by applying a physical holding force to a clamping ring or calipers located at the periphery of the workpiece. The workpiece is held in place until the physical force is reversed and the clamping ring or calipers retract. Electrostatic chucks perform this task by creating an electrostatic attractive force between the workpiece and the chuck. A voltage is applied to one or more electrodes in the chuck so as to induce opposite polarity charges in the workpiece and electrodes, respectively. The opposite charges pull the workpiece against the chuck, thereby retaining the workpiece. More specifically, in a "unipolar" electrostatic chuck, voltage is applied to the conductive pedestal relative to some internal chamber ground reference. Electrostatic force is established between the wafer being clamped and the electrostatic chuck. When the voltage is applied, the wafer is referred back to the same ground reference as the voltage source by a conductive connection to the wafer. Alternatively, a plasma generated proximate the wafer can reference the wafer to ground, although some voltage drop occurs across plasma sheaths that form at both the wafer being clamped and the reference electrode.

The materials and processes used to process a wafer are extremely temperature sensitive. Should these materials be exposed to excessive temperature fluctuations due to poor heat transfer from the wafer during processing, performance of the wafer processing system may be compromised resulting in wafer damage. To optimally transfer heat between the wafer and a chuck, a very large electrostatic or physical force is used in an attempt to cause the greatest amount of wafer surface to physically contact a support surface of the chuck. However, due to surface roughness of both the wafer and the chuck, small interstitial spaces remain between the chuck and wafer that interfere with optimal heat transfer.

To achieve further cooling of the wafer during processing, an inert gas such as Helium is pumped into the interstitial spaces formed between the wafer and the support surface. This gas acts as a thermal transfer medium from the wafer to the chuck that has better heat transfer characteristics than the vacuum it replaces. The chucks are generally designed to prevent the heat transfer gas from escaping into the surrounding low pressure atmosphere (i.e., the reaction chamber). Specifically, the support surface of electrostatic chucks have a circumferential raised rim having a diameter that is approximately equal to the diameter of the wafer and a flex circuit covering the support surface of the underlying pedestal. The flex circuit is usually a conductive material encased in a flexible dielectric material. The conductive material is patterned to form the electrostatic electrode(s). The dielectric material insulates the conductive material from other conductive components and also acts as a gasket. Once the wafer is clamped, a gas tight seal is created between the wafer and the rim. As such, heat transfer gas leakage from beneath the wafer at the rim is minimized. The clamping ring of mechanical chucks pushes down against a lip seal at the edge of the support surface of its pedestal to eliminate leakage. The lip seal is smaller than the dielectric "gasket" used in the electrostatic chuck, but is similar in principle. To further enhance the cooling process, the chuck is typically water-cooled via conduits within the pedestal. This cooling technique is known as backside gas cooling.

In the prior art, heat transfer gas distribution to the interstitial spaces is osmotic. Once a certain gas pressure is reached, pumping ceases and the gas becomes stagnant under the wafer. Since some of the interstitial spaces may not be interconnected, some spaces do not receive any heat transfer gas. This condition can lead to a non-uniform temperature profile across the wafer during processing and result in wafer damage. Effective and uniform heat conduction away from the wafer is an important aspect of the manufacturing process. Therefore, maximizing wafer area either in contact with the support surface or exposed to the heat transfer gas should contribute to the greatest heat transfer rate. As such, backside gas cooling art developed based on this premise.

However, the physical limitations of existing technology do not provide the necessary conditions for a uniform distribution of heat transfer gas in all of the interstitial spaces beneath the wafer. Existing pedestal topographies limit the effectiveness of the heat transfer process because they have a generally flat support surface and the wafers have a generally flat bottom surface. Ideally, these flat surfaces would have no defects or deviations so that the entire bottom surface of the wafer would contact the support surface to allow for maximum heat transfer from the wafer to the pedestal. General topographical anomalies create a condition where not all of the wafer is in contact with this support surface.

Electrostatic chucks attempt to solve this problem by providing a more uniform heat transfer gas layer across the entire bottom surface of the wafer. The flex circuit may be shaped in various configurations such as a flat plate across most of the support surface, as a series of concentric rings or radial arms to disperse the heat transfer gas across the entire bottom surface of the wafer. Additionally, the flex circuits have grooves or channels so the heat transfer gas can flow through and across the flex circuit somewhat uniformly. Nonetheless, the aforementioned interstitial spaces containing no gas still form and distribution of the gas could be compromised. Mechanical chucks may suffer from premature breakdown of the clamping components or non-uniform compression of the clamping ring or calipers which contributes to a loss of heat transfer gas pressure at the periphery lip seal.

Some gas leakage is expected in any type of chuck; therefore, a minimum gas pressure is maintained under the wafer at any given time to assure adequate gas density. If the gas escapes at a rate faster than anticipated, heat transfer characteristics of the device again become unstable and unreliable. Additionally, wafers secured to both types of chucks tend to bow at their centers resulting from the heat transfer gas pressure building up on the underside of the wafer. For mechanical chucks, the bowing action also could potentially lift the wafer away from the sealed areas. This condition contributes to a non-uniform heat transfer gas condition which results in poor temperature control across the wafer underside. Consequently, during processing, the temperature non-uniformity may result in non-uniform processing and wafer damage.

Therefore, there is a need in the art for an improved topographical structure of a semiconductor wafer processing chuck that maximizes heat transfer rate and improves temperature control and uniformity across the wafer without adding considerably to manufacturing costs.

SUMMARY OF THE INVENTION

The disadvantages heretofore associated with the prior art are overcome by an apparatus that clamps a wafer to a wafer support surface either mechanically or electrostatically. The inventive topography of the support surface is created by positioning heat transfer gas ports at the periphery of the workpiece support surface and flow vanes radially inward of the periphery to channel the gas from the periphery to a central drain. The gas is then conducted away from the drain via a sub-support surface channel to a pressure valve. The pressure valve is provided with a membrane. The membrane is of porosity and thickness such that gas will flow through the membrane only if a certain pressure is present beneath the wafer. To achieve a well-defined flow characteristic, the membrane is preferably ceramic. The newly positioned ports, vanes, drain and pressure valve eliminate the problems associated with static heat transfer gas conduction.

In a first embodiment of the invention, eight ports are arranged about the periphery of the support surface of a mechanical chuck. The support surface is divided into eight zones by a first set of vanes extending radially from the periphery of the support surface to the center drain. A second set of vanes positioned in front of each heat transfer gas port extending radially inward but not reaching the center divides the flow of the gas evenly through each zone as it travels to the center drain, down the sub-support surface channel to the pressure valve.

In a second embodiment of the invention, twelve ports are arranged about a periphery of the support surface of an electrostatic chuck. The support surface is divided into twelve zones by a first set of vanes extending from the periphery of the support surface in lengths alternating between about ⅙ and ¼ the radius of the support surface. A second set of vanes divides the flow of the gas evenly between the center drain and a plurality of U-shaped flow breaks positioned radially inward from the first set of vanes before allowing the gas to enter the sub-support surface channel and pressure valve.

This invention fulfills the long felt need for an apparatus that can efficiently clamp a wafer to a mechanical or electrostatic chuck and provide improved heat transfer characteristics. Specifically, the support surfaces in conjunction with the center drain, sub-support surface channel and pressure valve advantageously distribute heat transfer gas to the backside of a wafer in a more controlled and uniform fashion than previously possible. The low flow rate of the gas also provides minor cooling of the wafer by convection in addition to conduction resulting in a better quality end product and improved yields.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

Figure 1:
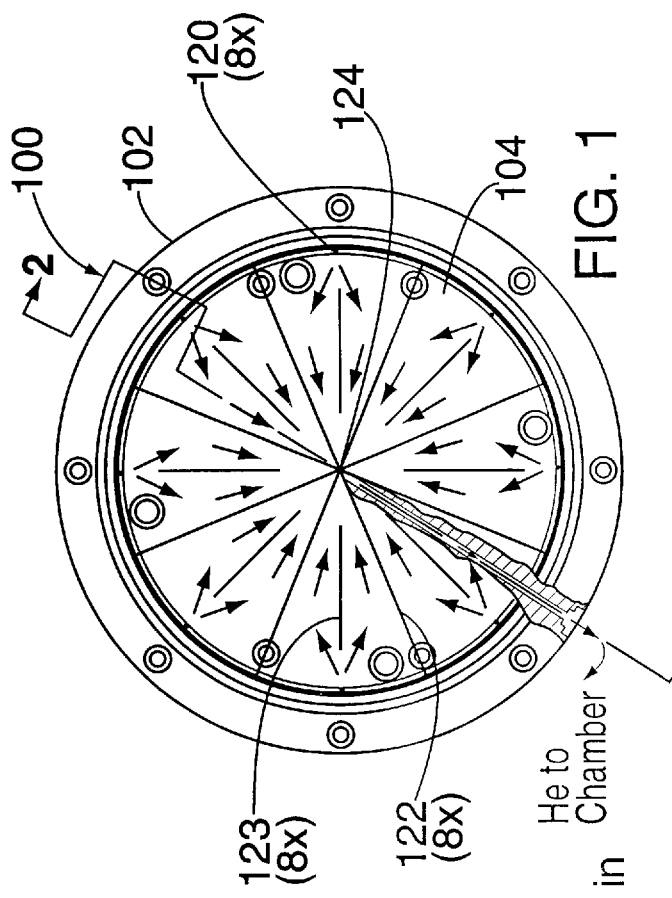
FIG. 1 depicts a top view of a mechanical clamping chuck providing a first embodiment of the inventive topography for improved heat transfer gas distribution.
Figure 2:
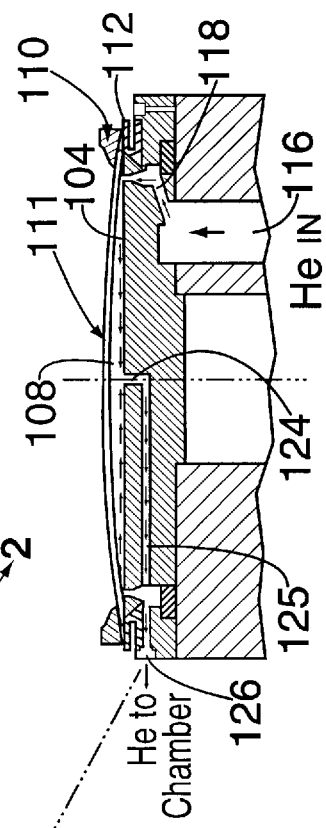
FIG. 2 depicts a cross-sectional view of the mechanical chuck taken along lines 2—2 of FIG. 1.

FIG. 1 depicts a top view of a mechanical clamping chuck 100 adapted to support and physically retain a workpiece to be processed, such as semiconductor wafer, on a pedestal 102 within a high density plasma reaction chamber (not shown). FIG. 2 depicts a cross-sectional view of the electrostatic chuck of FIG. 1 taken along line 2—2 with a semiconductor wafer 111 clamped in position. To best understand the invention, the reader should simultaneously refer to both FIGS. 1 and 2.

For a detailed understanding of the plasma reaction chamber and its operation in processing a wafer, the reader should refer to the drawings and the detailed description contained in U.S. Pat. No. 4,842,683, issued Jun. 27, 1989, incorporated herein by reference. That disclosure discloses a biased, high density plasma reaction chamber manufactured by Applied Materials, Inc. of Santa Clara, Calif.

The mechanical clamping chuck 100 is provided with a smooth support surface 104 on a pedestal 102. The diameter of the support surface 104 is slightly less than the diameter of the wafer 111 that it supports. At the edge of the support surface 104, a lip seal 112 is provided to seal a heat transfer gas in a volume of space 108 defined by the support surface 104 and the bottom edge of the wafer 111. A clamping ring 110 for retaining the wafer 111 during processing is located slightly above the support surface 104. The diameter of the clamping ring 110 is approximately equal to the diameter of the wafer 111. When engaged, the clamping ring 110 pushes downwards evenly about the wafer circumference until it contacts the lip seal 112.

The pedestal 102 is provided with a conduit 116 for conducting a heat transfer gas (preferably Helium) to the support surface 104 via a plenum 118. The plenum 118 feeds eight heat transfer gas ports 120 evenly and concentrically positioned proximate the periphery of the support surface 104. Since the gas is entering the volume 108 from a sealed periphery, it is forced to flow from the periphery to the center across the support surface 104. To aid in directing the flow of the gas, two sets of vanes are provided on the support surface 104. The first set of vanes 122 extend radially from the periphery of the support surface 104 to the center dividing the total area of the support surface 104 into eight equal zones. In between each vane, at the periphery, one heat transfer gas port 120 is positioned to supply gas to an associated zone. One vane from the second set 123 is positioned in front of each of the eight heat transfer gas ports 120 and extends radially inward towards (but not totally reaching) the center. All vanes in each set are uniform in width (0.5 mm) and height and support the wafer 0.05 mm above the support surface 104. In this configuration, the gas flowing from each port is evenly divided across each zone. The gas moves across the underside of the wafer 111 filling in the interstitial spaces as well as transferring heat. When the gas reaches the center of the support surface 104, it flows down to a drain 124 which conducts the heated gas away from the wafer 111 via a channel 125 below the support surface 104 to the reaction chamber.

Figure 3:
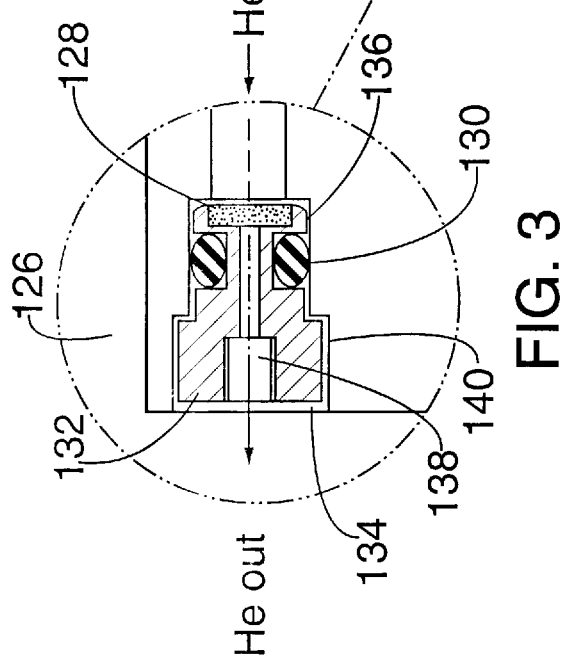
FIG. 3 depicts an enlarged view of the pressure valve on the left side of the pedestal seen in FIG. 2.

To maintain adequate gas pressure, a pressure valve 126 is provided at the end of the channel 125 from the drain 124 to the reaction chamber. Typically, the pressure valve is metal and is capable of maintaining a pressure comparable to that of the expected Helium leakage rate (e.g. 2 sccm). FIG. 3 displays a detailed view of the pressure valve 126. The pressure valve 126 has a casing 132 that is sized to accommodate a two stage bore 134 at the end of the channel 125. A narrow end 136 of the casing 132 is fitted with an O-ring seal 130 to prevent unwanted gas leakage or blowby. The pressure valve 126 has a two-stage opening 138 proportionate to the two-stage bore 134 extending from a wide end 140 of the casing 132 to slightly before the narrow end 136. The narrow end 136 is fitted with a membrane 128 which is bonded by an epoxy-based bonding material to the narrow end of the two-stage opening 136. Preferably the membrane is porous ceramic and of dimensions 10 mm×10 mm. The porosity of the membrane 128 allows the gas to pass through it and the two-stage opening 138 to the chamber. The membrane 128 therefore maintains an adequate gas pressure in the volume 108 to maintain a uniform layer of gas for heat conduction, yet allows gas to "leak" through the membrane to the reaction chamber. In this way, a controlled and limited flow of gas away from the wafer is realized. The typical flow rate is approximately 2 sccm. The wafer is therefore cooled slightly by convection, but mostly by conduction. However, such gas flow ensures that gas will reach and contact substantially the entire underside of the wafer.

Heat transfer gas flow can also be regulated by other means that are acceptable and logical for the conditions stated. A conventional valve for example may be manually activated during wafer processing or automatically activated by a feedback system monitoring heat transfer gas pressure. Additionally, a network of fixed diameter conduits below the support surface can be designed to maintain a predetermined flow rate and pressure. Other such control devices may be adapted for use in this apparatus by those familiar with the state of the art.

Figure 4:
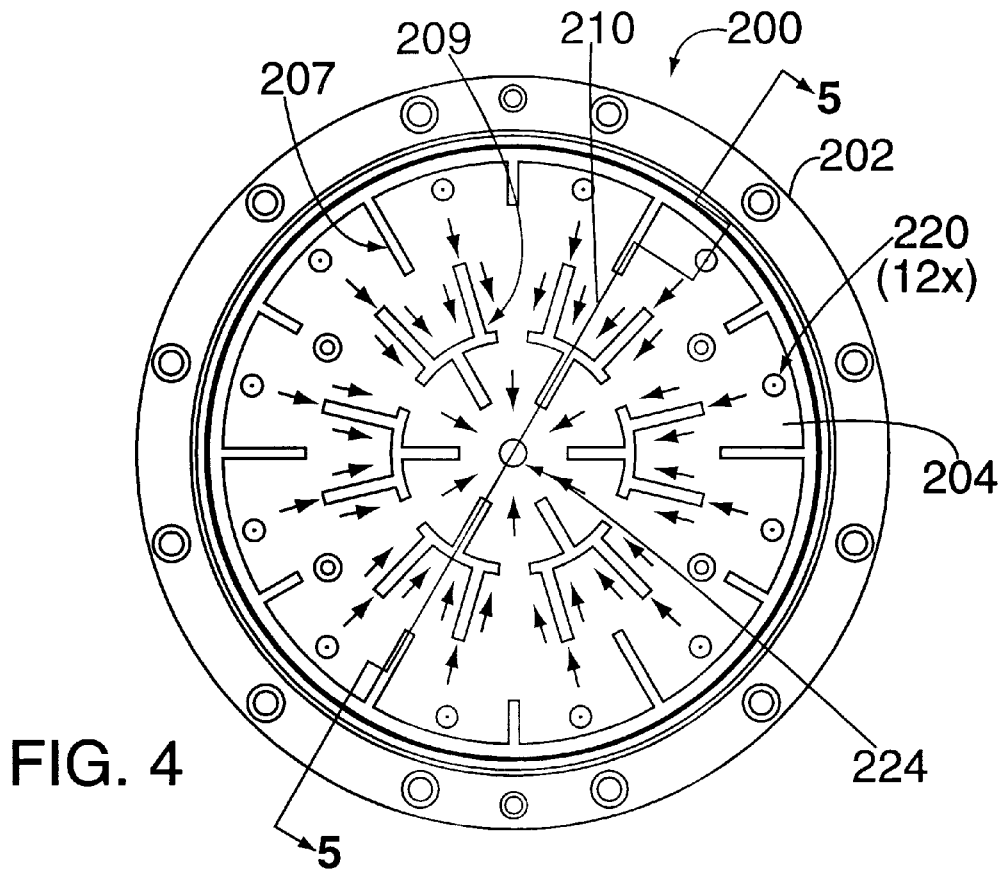
FIG. 4 depicts a top view of an electrostatic chuck providing a second embodiment of the inventive topography.
Figure 5:
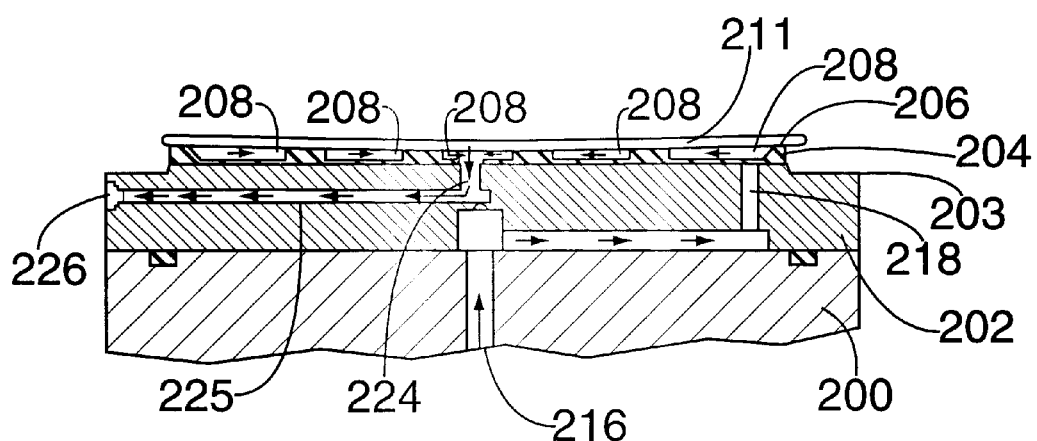
FIG. 5 depicts a cross-sectional view of the electrostatic chuck taken along lines 5—5 of FIG. 4.

FIGS. 4 and 5 depict a second embodiment of the invention, a support surface of an electrostatic chuck. Specifically, the chuck 200 contains a pedestal 202 with a surface 203 upon which a flex circuit 204 is adhered. The flex circuit 204 contains a patterned conductive layer encased in upper and lower dielectric layers (not shown). The flex circuit 204 is attached to the pedestal surface 203 by an adhesive layer (not shown) to create a support surface 206 for the wafer. The conductive layer is an electrode of the electrostatic chuck. Similar to the first embodiment, when the wafer 211 is placed on the support surface 206, a volume of space 208 is created below the wafer and above the support surface 206. When power is applied to the conductive layer, it creates an electrostatic force which draws the wafer 211 toward the support surface 206. This electrostatic force is also known as a clamping force. Since the dielectric material of the flex circuit 204 is semi-pliant, a relatively tight seal is created where the wafer contacts the support surface 206. As such, the volume of space 208 is sealed from the chamber vacuum when the wafer 211 is electrostatically clamped.

Similar to the vanes on the support surface of the first embodiment, the flex circuit 204 is configured with two sets of radially extending vanes. The first set 207 starts at the edge of the flex circuit 204 and moves radially inwards to divide the support surface 206 into twelve equal area zones. However, the vane length alternates every zone from about ⅛ to about ¼ of the distance from the periphery to the center. In between each vane, at the periphery, a heat transfer gas port 220 is positioned. The gas is discharged from the twelve ports 220 via a plenum 218 and conduit 216 similar to that of the mechanical clamping chuck and starts moving towards the center drain 224. The second set of vanes 209 divide the flow of the gas evenly between the center drain 224 and U-shaped flow breaks 210. The flow breaks 210 serve to redistribute the gas more fully throughout the volume 208 before proceeding to the center drain 224. As in the first embodiment, once the gas arrives at the drain 224, it proceeds through a subsurface channel 225 to the pressure valve 226 and is eventually vented to the reaction chamber. The elements and design of the pressure valve 226 for the electrostatic chuck are identical to those of the mechanical chuck.

With the uniform distribution of many heat transfer gas ports, directional vanes, drain and pressure valve, the interstitial spaces between the wafer and the support surface (104 or 206) are more fully reached. Thus, the surface area of the wafer exposed solely to the heat transfer gas is greatly increased and once heated, the gas is able to flow away from the wafer. This contributes to greater cooling capabilities of the chuck and more uniform temperature of the wafer during processing than experienced by the prior art.

Since there are a variety of parameters used in combination to achieve the desired heat transfer gas flow patterns, any or all of these parameters can be changed and the effect would remain the same. It can easily be seen for example, that reversing the gas flow direction (from the middle to the periphery) will achieve similar results. Valves or membranes can be positioned in a variety of locations (i.e., at each peripheral port) to regulate the pressure at each zone. Vane position and size can be reconfigured to optimize flow at different rates (pressures). Additionally, membrane thickness, plenum and drain dimensions can all be changed to create a new flow pattern.

Although various embodiments which incorporate the teachings of the present invention have been shown and described in detail herein, those skilled in the art can readily devise many other varied embodiments that still incorporate these teachings.

What is claimed is:

1. Apparatus for supporting a workpiece comprising:
   a chuck having a workpiece support surface with a periphery and a radius;
   at least one heat transfer gas supply port located in the support surface;
   a heat transfer gas drain located in the support surface; and
   a pressure valve attached to the drain via a sub-support surface channel, wherein the pressure valve contains a ceramic membrane.

2. The apparatus of claim 1 wherein the location of the heat transfer gas drain is at the center of the support surface.

3. The apparatus of claim 1 wherein the location of the heat transfer gas supply port is proximate the periphery of the support surface.

4. The apparatus of claim 1 wherein said support surface is adapted to direct a heat transfer gas flow from the periphery and across the support surface.

5. The apparatus of claim 4 wherein said chuck further comprises a mechanical clamp.

6. The apparatus of claim 5 having eight heat transfer gas supply ports.

7. The apparatus of claim 5 further comprising a first set of vanes extending radially from the periphery of the support surface to the drain dividing the total area of the support surface into eight zones of equal size and a second set of vanes positioned in front of each of the eight heat transfer gas ports, extending radially inward.

8. The apparatus of claim 4 wherein said chuck further comprises an electrostatic clamp.

9. The apparatus of claim 8 having twelve heat transfer gas supply ports.

10. The apparatus of claim 8 further comprising a first set of vanes extending from the periphery of the support surface in lengths alternating between about 1/6 and 1/4 the radius of the support surface and a second set of vanes dividing the flow of the gas evenly between the drain and a plurality of U-shaped flow breaks positioned radially inward from the first set of vanes.

11. The apparatus of claim 10 wherein the plurality of U-shaped flow breaks is six.

12. The apparatus of claim 1 wherein the pressure valve further comprises:
a casing having a wide end and a narrow end; and
a two-stage opening extending axially through the casing from the wide end to the narrow end, wherein the ceramic membrane is adhered to the two-stage opening at the narrow end of the casing.

13. Apparatus for supporting a workpiece comprising:
a chuck having a workpiece support surface with a periphery and a radius;
at least one heat transfer gas supply port located in the support surface;
a heat transfer gas drain located in the support surface;
a membrane attached to the drain via a sub-support surface channel; and
a plurality of vanes
wherein said heat transfer gas supply ports, drain, membrane, and plurality of vanes produce a controlled and limited flow of heat transfer gas in a volume between the workpiece and the support surface of the chuck.

14. The apparatus of claim 13 wherein said plurality of vanes further comprises:
a first set of vanes extending radially inward from the periphery of the support surface; and
a second set of vanes positioned proximate each of the heat transfer gas ports, extending radially inward.

15. The apparatus of claim 14 wherein the location of the heat transfer gas drain is at the center of the support surface.

16. The apparatus of claim 14 wherein the location of the heat transfer gas supply port is proximate the periphery of the support surface.

17. The apparatus of claim 16 wherein said chuck further comprises a mechanical clamp.

18. The apparatus of claim 17 having eight heat transfer gas supply ports.

19. The apparatus of claim 17 wherein the first set of vanes divides the total area of the support surface into eight zones of equal size and the second set of vanes are positioned in front of each of the eight heat transfer gas ports.

20. The apparatus of claim 16 wherein said chuck further comprises an electrostatic clamp.

21. The apparatus of claim 20 having twelve heat transfer gas supply ports.

22. The apparatus of claim 20 wherein the first set of vanes alternate in length between about 1/6 and 1/4 the radius of the support surface and the second set of vanes divide the flow of the gas evenly between the drain and a plurality of U-shaped flow breaks positioned radially inward from the first set of vanes.

23. The apparatus of claim 22 wherein the plurality of U-shaped flow breaks is six.

24. Apparatus for retaining a workpiece comprising:
a chuck having a workpiece support surface with a periphery and a center;
a plurality of heat transfer gas ports positioned proximate the periphery of the support surface;
a drain positioned proximate the center of the support surface;
a pressure valve attached to the drain via a sub-support surface channel; the pressure valve having,
a casing having a wide end and a narrow end; a two-stage opening extending axially through the casing from the wide end to the narrow end; a porous ceramic membrane adhered to the two-stage opening at the narrow end of the casing;
a first set of vanes extending radially inward from the periphery of the support surface; and
a second set of vanes positioned proximate each of the heat transfer gas ports, extending radially inward.

* * * * *